(12) United States Patent
Froude et al.

(10) Patent No.: US 6,361,332 B1
(45) Date of Patent: Mar. 26, 2002

(54) RETENTION SYSTEM FOR ELECTRICAL CONNECTORS

(75) Inventors: Ray Froude, Bartlett; Yan Margulis, Buffalo Grove; James Roberts, Oak Park, all of IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/827,422

(22) Filed: Apr. 6, 2001

(51) Int. Cl.⁷ .............................................. H01R 12/00
(52) U.S. Cl. ......................................... 439/83; 439/570
(58) Field of Search .................... 439/570, 83, 567, 439/607, 609, 876, 495

(56) References Cited

U.S. PATENT DOCUMENTS

| | | | |
|---|---|---|---|
| 4,025,147 A | 5/1977 | Van Arsdale et al. | |
| 5,096,440 A | 3/1992 | Katsumata | 439/570 |
| 5,120,256 A | 6/1992 | Walden | 439/553 |
| 5,133,670 A | 7/1992 | Doi et al. | 439/79 |
| 5,145,405 A | 9/1992 | Akiyama | 439/525 |
| 5,533,908 A | 7/1996 | Henry et al. | 439/329 |
| 5,688,143 A * | 11/1997 | McHugh et al. | 439/495 |
| 5,971,800 A | 10/1999 | Azuma et al. | 439/502 |
| 6,053,767 A | 4/2000 | Copper et al. | 439/567 |
| 6,254,429 B1 * | 7/2001 | Morita | 439/570 |

* cited by examiner

Primary Examiner—Khiem Nguyen
(74) Attorney, Agent, or Firm—Stephen Z. Weiss

(57) ABSTRACT

A retention system is provided for a surface mounted electrical connector on a printed circuit board. A dielectric connector housing is adapted for mounting on a surface of the printed circuit board. A plurality of terminals are mounted on the housing for engaging appropriate circuit traces on the printed circuit board. A retaining clip is mounted on the housing and includes a board mounting tab for solder connection to an appropriate ground trace on the surface of the printed circuit board. The tab mounting tab has an opening. A conductive shield is disposed about portions of the housing and includes a projection extending into the opening in the board mounting tab. Therefore, solder material engages the projection of the shield through the opening in the board mounting tab to thereby mechanically and electrically secure both the retaining clip and the shield to the printed circuit board.

18 Claims, 2 Drawing Sheets

FIG.1

RETENTION SYSTEM FOR ELECTRICAL CONNECTORS

FIELD OF THE INVENTION

This invention generally relates to the art of electrical connectors and, particularly, to a retention system for a surface mounted electrical connector on a printed circuit board.

BACKGROUND OF THE INVENTION

There are a wide variety of electrical connectors which are designed for mounting on a printed circuit board. The connectors include dielectric housings which mount a plurality of conductive terminals. Often, a metal shield substantially surrounds the housing to protect the interconnected circuits from radio frequency (RF) and/or electromagnetic (EMI) interference. In some connectors, the terminals have tail portions and the shield has leg portions, with the tail portions and leg portions extending downwardly from the housing for insertion into appropriate holes in the printed circuit board. In other connectors, often called "surface mount" connectors, the tail portions of the terminals are bent for surface engaging circuit traces on the surface of the printed circuit board.

With surface mounted electrical connectors of the character described above, typically there are two different approaches for electrically connecting the shields of the connectors to appropriate ground circuit traces on the printed circuit board. One approach simply employs board-mounting tabs integral with the shields and bent into configurations for surface connection, as by soldering, to the ground circuit traces on the printed circuit board. With such integral mounting tabs, considerable problems are encountered in maintaining the mounting tabs of the shield coplanar with the surface engaging tail portions of the terminals. Without coplanarity, defective connections may result when the mounting tabs and tail portions are soldered to the circuit traces on the circuit board.

Another approach is to use separate conductive metal retaining clips which are mounted on the dielectric housing of the connector, with the retaining clips including board mounting tabs. However, the separate retaining clips must be maintained in mechanical and electrical engagement with the shield of the connector, and problems often are encountered in guaranteeing good electrical continuity between the shield and the retaining clips.

The present invention is directed to solving these problems in a retention system which uses surface mounted retaining clips with a unique system for electrically coupling the retaining clips to the connector shields.

SUMMARY OF THE INVENTION

An object, therefore, of the invention is to provide a new and improved retention system for a surface mounted electrical connector on a printed circuit board.

In the exemplary embodiment of the invention, a dielectric connector housing is adapted for mounting on a surface of the printed circuit board. A plurality of terminals are mounted on the housing for engaging appropriate circuit traces on the printed circuit board. At least one retaining clip is mounted on the housing and includes a board-mounting tab for solder connection to an appropriate ground trace on the surface of the printed circuit board. The mounting tab has an opening. A conductive shield is disposed about portions of the housing and includes a projection extending into the opening in the board-mounting tab of the retaining clip. Therefore, during solder connection of the retaining clip to the circuit board, solder material engages the projection of the shield through the opening in the mounting tab to thereby mechanically and electrically secure both the retaining clip and the shield to the printed circuit board.

As disclosed herein, the board mounting tab of the retaining clip extends generally parallel to the surface of the printed circuit board for surface-engagement therewith. The shield includes a wall extending generally perpendicular to the surface of the printed circuit board. The projection on the shield is located at a bottom edge of the wall. Preferably, at least a pair of the retaining clips are mounted on the housing at opposite sides thereof.

Another feature of the invention is to provide a redundant coupling path between the conductive shield and the retaining clip. In particular, the retaining clip includes a body mounted to the connector housing. The board mounting tab projects from the body. In addition, an engagement flange also projects from the body for engaging the shield to provide a secondary or redundant conductive path from the ground trace on the printed circuit board, through the retaining clip, to the shield. The housing also includes a locking flange engageable by the engagement flange of the retaining clip, whereby the engagement flange performs a dual function of locking the retaining clip to the housing.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
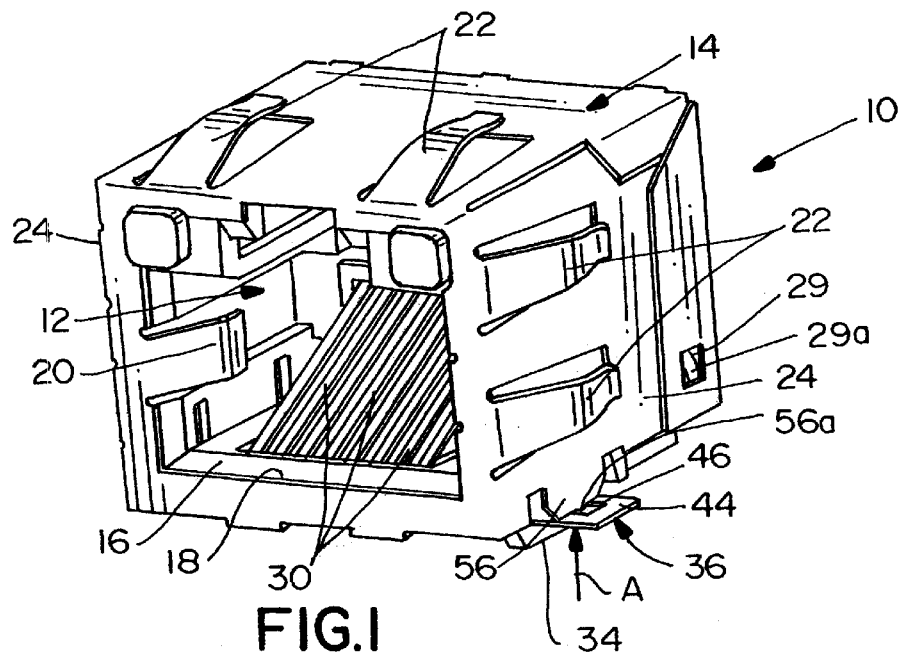
FIG. 1 is a top perspective view looking at the front mating end of an electrical connector embodying the concepts of the invention.
Figure 2:
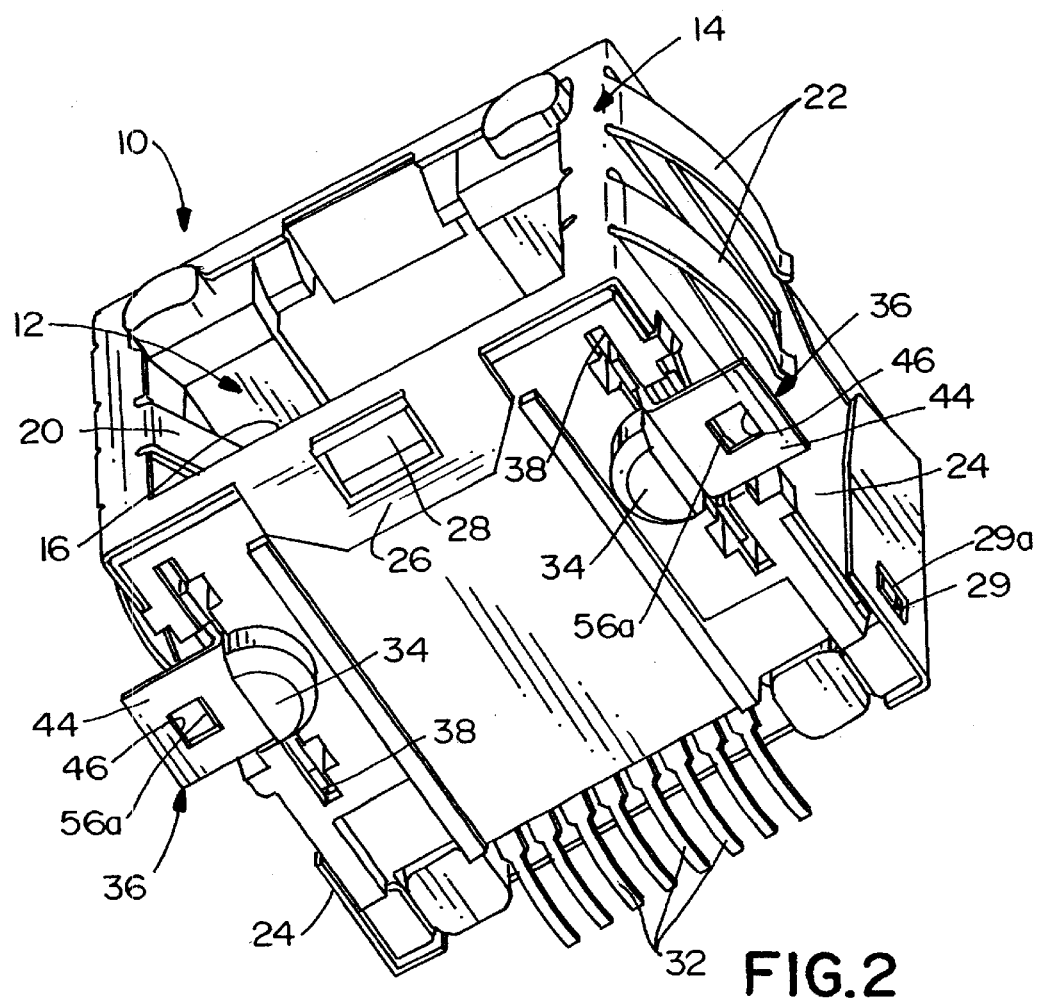
FIG. 2 is a bottom perspective view of the connector of FIG. 1.

Referring to the drawings in greater detail, and first to FIGS. 1 and 2, the invention is embodied in an electrical connector, generally designated 10, which is designed for mounting on a surface of a printed circuit board (not shown). The connector herein is in the form of a modular telephone jack which, generally, is known in the art. However, it should be understood that the invention is equally applicable for use in a wide variety of shielded electrical connectors.

With that understanding, the electrical connector or modular jack 10 includes a dielectric housing, generally designated 12, substantially surrounded by a conductive shield, generally designated 14. The housing may be a one-piece structure which is unitarily molded of plastic material or the like. The shield may be a one-piece structure which is stamped and formed of conductive sheet metal material. Both the housing and the shiled may also be a multi-piece structure. Housing 12 has a generally rectangular opening 16 which is coincident with a front opening 18 in the shield to form a receptacle for a conventional modular jack plug. The shield has a plurality of flexible fingers 20 which are bent into the receptacle for engaging an outer shield of the plug. The shield also has a plurality of outwardly bent flexible fingers 22 for engaging an appropriate support structure within which the shield may be mounted. The shield includes a pair of opposite side walls 24 which are oriented in a direction generally perpendicular to the printed circuit board, i.e., generally vertically if the board is generally horizontal. Finally, as seen in FIG. 2, the shield has an apertured locking flange 26 at the bottom thereof for interengagement with a locking boss 28 molded integrally with the bottom of housing 12. Locking hole 29 is provided at each of the bottom rear corners of the shield for receiving locking boss 29a on the outside of each rear corner of the housing.

A plurality of terminals are mounted within dielectric housing 12 in a manner typical of modular jacks. In particular, the terminals have contact portions 30 (FIG. 1) which extend at angles into the receptacle of the connector for engagement with the contacts of the modular jack plug. A plurality of tail portions 32 (FIG. 2) of the terminals project outwardly of the rear of the connector for surface engagement with appropriate circuit traces on the printed circuit board. FIG. 2 also shows that housing 12 has a pair of locating posts 34 for insertion into appropriate locating holes in the printed circuit board.

Figure 3:
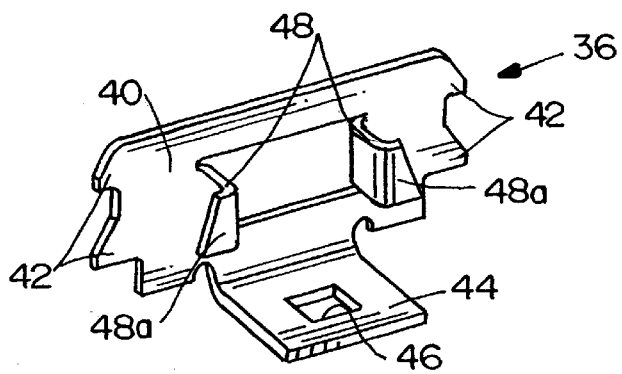
FIG. 3 is an enlarged perspective view of one of the retaining clips.

FIGS. 1 and 2 show that a pair of retaining clips, generally designated 36, are mounted in a pair of mounting slots 38 (FIG. 2) at the bottom of housing 12 and generally in line with side walls 24 of shield 14. FIG. 3 shows the details of one of the retaining clips. Specifically, each retaining clip is stamped and formed of conductive sheet metal material and includes a generally planar body 40 which is inserted into a respective one of the slots 38 in the dielectric plastic housing. Teeth or barbs 42 are formed at opposite side edges of the body for biting into the plastic material of the housing within slots 38 to lock the retaining clips in the housing. Each retaining clip includes a board mounting tab 44 which is bent outwardly from body 40 generally perpendicular thereto. The board mounting tab has an opening 46 therethrough. A pair of engagement flanges 48 are stamped and formed out of body 40 and extend outwardly therefrom. The engagement flanges terminate in chamfered distal ends or tips 48a which are bent generally parallel to body 40.

Figure 4:
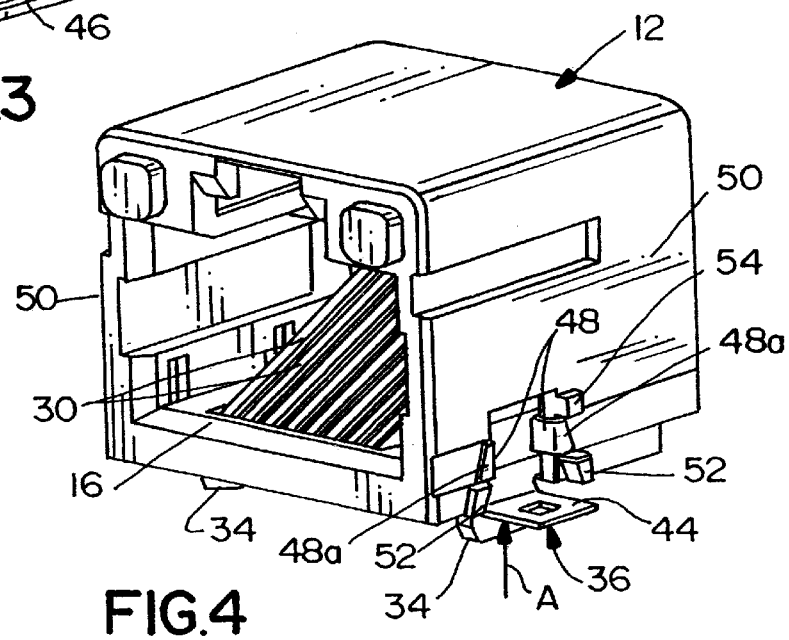
FIG. 4 is a view similar to that of FIG. 1, with the shield of the connector removed.

When retaining clips 36 are inserted into slots 38 (FIG. 2) in the bottom of housing 12 in the direction of arrow "A" (FIG. 1). Board mounting tabs 44 project outwardly from the housing beyond side walls 24 of shield 14 as seen in FIGS. 1 and 2. Appropriate jigging is used when inserting the retaining clips to ensure that board mounting tabs 44 are generally coplanar with tail portions 32 of the terminals. As seen in FIG. 4, engagement flanges 48 of the retaining clips project outwardly beyond side walls 50 of housing 12. In fact, the engagement flanges project sufficiently outwardly so that their distal ends 48a make good engagement with the insides of side walls 24 of shield 14. Therefore, there is good metal-to-metal contact between the metal shield and the metal retaining clips.

FIG. 4 also shows that housing 12 includes a pair of chamfered locking flanges 52 molded integrally therewith and projecting outwardly therefrom at each side 50 of the housing. When the mounting clip is inserted into the housing in the direction of arrow "A", distal ends 48a of engagement flanges 48 of the retaining clip snap into locking engagement behind locking flanges 52 of the housing. Still further, a stop flange 54 is molded integrally with the housing for engaging the distal end of one of the engagement flanges 48. This stop flange defines the limit of insertion of the retaining clip to ensure that board mounting tab 44 is in a proper position for maintaining coplanarity with tail portions 32 of the terminals. From the foregoing, it can be understood that engagement flanges 48/48a perform multiple functions of (a) conductively commoning the metal retaining clips to the metal shield, (b) providing a locking means with the housing and (c) providing a stop limit for insertion of the clips into the housing.

Figure 5:
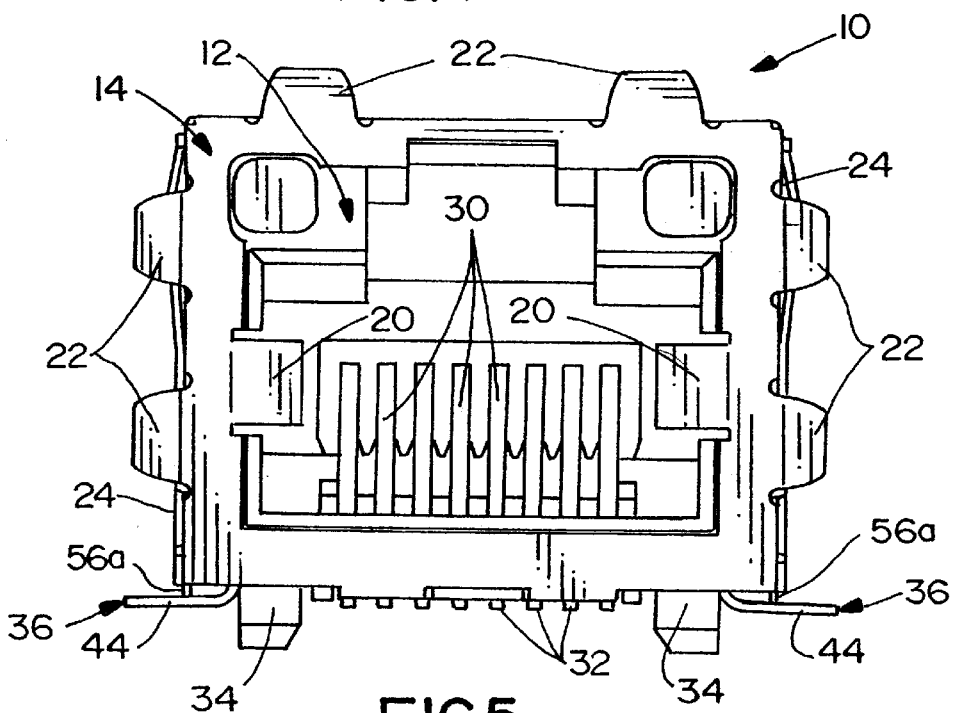
FIG. 5 is a front elevational view of the connector of FIG. 1.

Another unique feature of the invention is the provision of a projection 56 from the bottom of each side wall 24 of shield 14, with the projection having a tip portion 56a for insertion into opening 46 in board mounting tab 44 of the respective retaining clip. FIG. 5 shows how board mounting tabs 44 project outwardly from the connector housing beyond side walls 24 of shield 14, in a generally horizontal direction which is parallel to the printed circuit board. Tips 56a of projections 56 project downwardly from side walls 24 of the shield generally perpendicular to the printed circuit board. Tips 56a of the projections extend into openings 46 of mounting tabs 44 as seen in FIGS. 1 and 2. Therefore, when terminal tail portions 32 and board mounting tabs 44 are soldered to appropriate signal circuit traces and ground circuit traces, respectively, on the printed circuit board, the solder material engages tip portions 56a of projections 56 of the shield through openings 46 in board mounting tabs 44. As a result, the soldering process mechanically and electrically secures both the retaining clips and the shield to the ground circuit traces on the printed circuit board. FIG. 5 shows board mounting tabs 44 and terminal tail portions 32 coplanar for surface mounting connector 10 on the printed circuit board.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A retention system for a surface mounted electrical connector on a printed circuit board, comprising:
    a dielectric connector housing adapted for mounting on a surface of the printed circuit board;
    a plurality of terminals mounted on the housing for engaging appropriate circuit traces on the printed circuit board;
    a retaining clip mounted on the housing and including a board mounting tab for solder connection to an appropriate ground trace on the surface of the printed circuit board, the tab having an opening; and
    a conductive shield about portions of the housing and including a projection extending into the opening in the board mounting tab of the retaining clip,
    whereby solder material engages the projection of the shield through the opening in the board mounting tab to thereby mechanically and electrically secure both the retaining clip and the shield to the printed circuit board.

2. The retention system of claim 1 wherein the board mounting tab of said retaining clip extends generally parallel to the surface of the printed circuit board for surface-engagement therewith.

3. The retention system of claim 2 wherein said shield includes a wall extending generally perpendicular to the surface of the printed circuit board, said projection being located at a bottom edge of the wall.

4. The retention system of claim 1, including a pair of said retaining clips mounted on the housing at opposite sides thereof.

5. The retention system of claim 1 wherein said retaining clip includes a body mounted to the housing, with said board mounting tab projecting from the body, and including an engagement flange also projecting from the body for engaging the shield to provide a secondary conductive path from the ground trace on the printed circuit board through the retaining clip to the shield.

6. The retention system of claim 5 wherein said housing includes a locking flange engageable by the engagement flange of the retaining clip whereby the engagement flange performs a dual function of locking the retaining clip to the housing.

7. The retention system of claim 6 wherein said housing includes a stop flange engageable by the engagement flange of the retaining clip whereby the engagement flange performs a further function of defining a stop limit means for mounting the retaining clip on the housing.

8. A retention system for a surface mounted electrical connector on a printed circuit board, comprising:

a dielectric connector housing adapted for mounting on a surface of the printed circuit board;

a plurality of terminals mounted on the housing for engaging appropriate circuit traces on the printed circuit board;

a generally L-shaped retaining clip including a body mounted to the bottom of the housing generally perpendicular to the printed circuit board and a board mounting tab projecting from the body generally parallel to the surface of the circuit board for surface-engagement therewith by a solder connection to an appropriate ground trace on the surface of the printed circuit board, the board mounting tab having an opening; and a conductive shield about portions of the housing and including a side wall extending generally perpendicular to the surface of the printed circuit board, the side wall including a projection at the bottom edge thereof extending into the opening in the board mounting tab of the retaining clip, whereby solder material engages the projection of the shield through the opening in the board mounting tab to thereby mechanically and electrically secure both the retaining clip and the shield to the printed circuit board.

9. The retention system of claim 8, including a pair of said retaining clips mounted on the housing at opposite sides thereof.

10. The retention system of claim 8 wherein said retaining clip includes an engagement flange projecting from the body of the clip for engaging the shield to provide a secondary conductive path from the ground trace on the printed circuit board through the retaining clip to the shield.

11. The retention system of claim 10 wherein said housing includes a locking flange engageable by the engagement flange of the retaining clip whereby the engagement flange performs a dual function of locking the retaining clip to the housing.

12. The retention system of claim 11 wherein said housing includes a stop flange engageable by the engagement flange of the retaining clip whereby the engagement flange performs a further function of defining a stop limit means for mounting the retaining clip on the housing.

13. A retention system for a surface mounted electrical connector on a printed circuit board, comprising:

a dielectric connector housing adapted for mounting on a surface of the printed circuit board;

a plurality of terminals mounted on the housing for engaging appropriate circuit traces on the printed circuit board;

a retaining clip mounted on the housing and including a planar body perpendicular to the printed circuit board and a board mounting tab for solder connection to an appropriate ground trace on the surface of the printed circuit board;

a conductive shield about portions of the housing and including a projection extending from the shield to a position juxtaposed with the mounting tab of the retaining clip; and an engagement flange extending from the planar body of the retaining clip remote from the projection of the shield into engagement with the shield, whereby solder material engages the projection of the shield simultaneously with engaging the board mounting tab to thereby mechanically and electrically secure both the retaining clip and the shield to the printed circuit board, while the engagement flange provides a secondary conductive path from the ground trace on the printed circuit board through the retaining clip to the shield.

14. The retention system of claim 13 wherein the board mounting tab of said retaining clip extends generally parallel to the surface of the printed circuit board for surface-engagement therewith.

15. The retention system of claim 14 wherein said shield includes a wall extending generally perpendicular to the surface of the printed circuit board, said projection being located at a bottom edge of the wall.

16. The retention system of claim 13, including a pair of said retaining clips mounted on the housing at opposite sides thereof.

17. The retention system of claim 13 wherein the housing includes a locking flange engageable by the engagement flange of the retaining clip whereby the engagement flange performs a dual function of locking the retaining clip to the housing.

18. The retention system of claim 17 wherein said housing includes a stop flange engageable by the engagement flange of the retaining clip whereby the engagement flange performs a further function of defining a stop limit means for mounting the retaining clip on the housing.

* * * * *